(12) United States Patent
Hsieh et al.

(10) Patent No.: US 7,567,127 B2
(45) Date of Patent: Jul. 28, 2009

(54) AUTOMATIC-GAIN CONTROL CIRCUIT

(75) Inventors: Yi-Bin Hsieh, Taipei County (TW); Hisn-Kuang Chen, Taipei County (TW); Che-Wei Hsu, Changhua County (TW)

(73) Assignee: Princeton Technology Corporation, Hsin Tien, Taipei County (TW)

( * ) Notice: Subject to any disclaimer, the term of this patent is extended or adjusted under 35 U.S.C. 154(b) by 125 days.

(21) Appl. No.: 11/567,199

(22) Filed: Dec. 5, 2006

(65) Prior Publication Data
US 2008/0068087 A1 Mar. 20, 2008

(30) Foreign Application Priority Data
Sep. 20, 2006 (TW) .............................. 95134800 A

(51) Int. Cl.
*H03F 3/28* (2006.01)

(52) U.S. Cl. .................. 330/291; 330/293; 330/298
(58) Field of Classification Search ................. 330/298, 330/291, 293
See application file for complete search history.

*Primary Examiner*—Michael B Shingleton
(74) *Attorney, Agent, or Firm*—Winston Hsu

(57) ABSTRACT

An automatic-gain control circuit includes a variable-gain amplifier, a peak-detecting circuit, and an adjustable charge/discharge circuit. The variable-gain amplifier receives an input signal and adjusts the input signal based on a gain-factor control signal for generating a corresponding output signal. The peak-detecting circuit is coupled to the variable-gain amplifier for generating a comparing signal according to a reference signal and the output signal. The adjustable charge/discharge circuit is coupled to the peak-detecting circuit and the variable-gain amplifier for outputting a charge current or a discharge current based on the comparing signal, thereby generating the gain-factor control signal. The ratio between the charge current and the discharge current is adjustable.

14 Claims, 6 Drawing Sheets

AUTOMATIC-GAIN CONTROL CIRCUIT

BACKGROUND OF THE INVENTION

1. Field of the Invention

The present invention relates to an automatic-gain control circuit, and more particularly, to an automatic-gain control circuit capable of controlling the gain using a variable current source.

2. Description of the Prior Art

In a modernized society, various paper, data, information and video/audio signals can be processed and transmitted as electronic signals. Therefore, signal-processing circuits capable of processing electronic signals have become very important. In order to efficiently process electronic signals in a data system, many gain-amplifying circuits are required for maintaining the amplitude of the electronic signals adequately. A gain-amplifying circuit is an amplifier capable of enlarging an input signal, outputting the enlarged input signal and adjusting the amount of gain based on a control signal. Among various gain-amplifying circuits, a variable gain-amplifying circuit capable of adjusting the amplitude of the electronic signals adequately is often designed as an automatic-gain control (AGC) circuit in order to adjust the amplitude of the electronic signals automatically.

Since the gain of a variable gain-amplifying circuit can be controlled by a control signal, the variable gain characteristics of the variable gain-amplifying circuit can be represented by how the gain varies with the control signal. Generally speaking, it is preferable to design a variable gain-amplifying circuit having a wider amplifying range, better control characteristics (such as high linearity), and higher resistance against characteristic shifts due to process or temperature variations. A variable gain-amplifying circuit having a wider amplifying range can adjust its gain to a larger degree, provide electronic signals with more distinct amplitudes, and thus can be used in more applications. A variable gain-amplifying circuit having better control characteristics can be controlled more accurately. In a variable gain-amplifying circuit having higher resistance against characteristic shifts due to process or temperature variations, external influences on the variable gain characteristics can be reduced, and the overall performance of the system can be improved.

Reference is made to FIG. 1 for a diagram of a prior art AGC circuit 10. The AGC circuit 10 includes a variable-gain amplifier (VGA) 12, a peak-detecting circuit 14, a constant charge/discharge circuit 16, and a digital-to-analog converter (DAC) 18. The VGA 12 receives an input signal $V_{IN}$ at an input end and adjusts the input signal $V_{IN}$ based on a gain-factor control signal $V_{CTL}$, thereby generating a corresponding output signal $V_{OUT}$ at an output end. In the prior art AGC circuit 10, the gain-factor control signal $V_{CTL}$ is generated by the peak-detecting circuit 14 and the constant charge/discharge circuit 16 based on the output signal $V_{OUT}$. Therefore, automatic-gain control can be performed in a feedback mechanism.

In the prior art AGC circuit 10, the gain-factor control signal $V_{CTL}$ can be varied when the DAC 18 outputs different threshold signals $V_T{'}$, and the gain of the VGA 12 can be adjusted accordingly. The peak-detecting circuit 14 includes a positive-phase differential comparator 21, negative-phase differential comparator 22, and an OR gate 23. The positive-phase differential comparator 21 includes a positive input end coupled to the VGA 12 for receiving the output signal $V_{OUT}$ and an negative input end coupled to the DAC 18 for receiving the threshold signal $V_T{'}$. The positive-phase differential comparator 21 can differentially compare the output signal $V_{OUT}$ with the threshold signal $V_T{'}$, thereby generate a corresponding positive-phase comparing signal $V_+$ at its output end. The negative-phase differential comparator 22 includes a positive input end coupled to the DAC 18 for receiving the threshold signal $V_T{'}$ and a negative input end coupled to the VGA 12 for receiving the output signal $V_{OUT}$. The negative-phase differential comparator 22 can differentially compare the output signal $V_{OUT}$ with the threshold signal $V_T{'}$, thereby generate a corresponding negative-phase comparing signal $V_-$ at its output end. The OR gate 23, coupled between the output ends of the positive-phase differential comparator 21 and the negative-phase differential comparator 22, can generate a corresponding comparing signal $V_{GATE}$ based on the positive-phase comparing signal $V_+$ and the negative-phase comparing signal $V_-$.

The constant charge/discharge circuit 16 includes a capacitor C, a constant charge current source $I_P$, a constant discharge current source $I_N$, a charge switch $SW_P$, and a discharge switch $SW_N$. The charge switch $SW_P$ can include a P-type metal oxide semiconductor (PMOS) transistor, and the discharge switch $SW_N$ can include an N-type metal oxide semiconductor (NMOS) transistor. The gates of the charge switch $SW_P$ and the discharge switch $SW_N$ are coupled to the OR gate 23. When the comparing signal $V_{GATE}$ has a high voltage level, the charge switch $SW_P$ is turned off (open-circuited) and the discharge switch $SW_N$ is turned on (short-circuited). Therefore, the constant charge/discharge circuit 16 can discharge the capacitor C using the constant discharge current source $I_N$ and the discharge switch $SW_N$. When the comparing signal $V_{GATE}$ has a low voltage level, the charge switch $SW_P$ is turned on and the discharge switch $SW_N$ is turned off. Therefore, the constant charge/discharge circuit 16 can charge the capacitor C using the constant charge current source $I_P$ and the charge switch $SW_P$. In the prior art AGC circuit 10, the constant charge current source $I_P$ and the constant discharge current source $I_N$ provide constant charging and discharge currents, respectively.

Reference is made to FIG. 2 for a signal diagram illustrating the operation of the prior art AGC circuit 10. In FIG. 2, the waveform of the output signal $V_{OUT}$ is represented by a sine wave having an amplitude $V_M$ and a central level $V_{REF}$. The transverse axle represents time, and a period $(0\sim2\pi)$ is depicted in FIG. 2. When the absolute value of the output signal $V_{OUT}$ is smaller than that of the threshold signal $V_T{'}$, the constant charge/discharge circuit 16 performs charging operation, such as during the time periods $0\sim\theta$, $(\pi-\theta)\sim(\pi+\theta)$ and $(2\pi-\theta)\sim2\pi$ (as illustrated by diagonal regions of the sine wave in FIG. 2). When the absolute value of the output signal $V_{OUT}$ is larger than that of the threshold signal $V_T{'}$, the constant charge/discharge circuit 16 performs discharging operation, such as during the time periods $\theta\sim(\pi-\theta)$ and $(\pi+\theta)\sim(2\pi-\theta)$ (as illustrated by blank regions of the sine wave in FIG. 2). The value of $\theta$ depends on the level of the threshold voltage $V_T{'}$. As the absolute value of the threshold voltage $V_T{'}$ increases, the charging time $T_P (T_P=4\theta)$ of the constant charge/discharge circuit 16 becomes longer. As the absolute value of the threshold voltage $V_T{'}$ decreases, the discharging time $T_N (T_N=2\pi-4\theta)$ of the constant charge/discharge circuit 16 becomes longer.

When the AGC circuit 10 performs charging and discharging operations, corresponding charging electronic charges $Q_P$ and discharging electronic charges $Q_N$ can be represented by the following formulae:

$$Q_P = I_P T_P = I_P(4\theta)$$

$$Q_N = I_N T_N = I_N(2\pi-4\theta)$$

When the AGC circuit 10 is stabilized, the charging electronic charges $Q_P$ and the discharging electronic charges $Q_N$ reach an equilibrium state. Therefore, the following relationships can be obtained:

$$Q_P = Q_N$$

$$I_N/I_P = 2\theta/(\pi - 2\theta)$$

If N is used for representing the value of $I_N/I_P$, the value of $\theta$ can be represented by the following formula:

$$\theta = \frac{\pi}{2} \times \frac{N}{N+1}$$

Also, the relationship between the amplitude $V_M$ of the output signal $V_{OUT}$ and the threshold signal $V_T'$ can be represented by the following formula:

$$V_M \sin\theta = V_T'$$

As a result, the following relationships can be obtained:

$$V_M = V_T'/\sin\theta = V_T' \Big/ \sin\!\left(\frac{\pi}{2} \times \frac{N}{N+1}\right)$$

In order for the AGC circuit 10 to have better control characteristics, the value of the threshold signal $V_T'$ has to be close to the target amplitude $V_M$ of the output signal $V_{OUT}$, so that the amplitude $V_M$ of the output signal $V_{OUT}$ can be varied by adjusting the threshold signal $V_T'$. Therefore, in order to reduce the difference between the absolute values of $V_T'$ and $V_M$, it is preferable when the value of $\theta$ approaches $\pi/2$ and the value of N approaches infinity. In the prior art AGC circuit 10, N is normally set to a constant value (such as N=10). The AGC circuit 10 can have better control characteristics as the target amplitude $V_M$ of the output signal $V_{OUT}$ is varied by adjusting the threshold signal $V_T'$.

Since the threshold signal $V_T'$ is close to the target amplitude $V_M$ of the output signal $V_{OUT}$ in the prior art AGC circuit 10, a high-speed positive-phase differential comparator 21 and a high-speed negative-phase differential comparator 22 are required for determining the difference between the threshold signal $V_T'$ and the output signal $V_{OUT}$ accurately, so that the AGC circuit 10 can switch between charging/discharging operations correctly. Also, the DAC 18 for providing the threshold signal $V_T'$ occupies large circuit space in the prior art AGC circuit 10 and consumes more power.

SUMMARY OF THE INVENTION

The present invention provides an automatic-gain control circuit comprising a variable-gain amplifier for receiving an input signal and adjusting the input signal based on a gain-factor control signal, thereby generating a corresponding output signal; a peak-detecting circuit coupled to the variable-gain amplifier for generating a comparing signal based on a reference signal and the output signal; and an adjustable charge/discharge circuit having an input end coupled to the peak-detecting circuit and an output end coupled to the variable-gain amplifier for outputting a charge current or a discharge current based on the comparing signal, thereby generating the gain-factor control signal, wherein a ratio between the charge current and the discharge current is adjustable.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
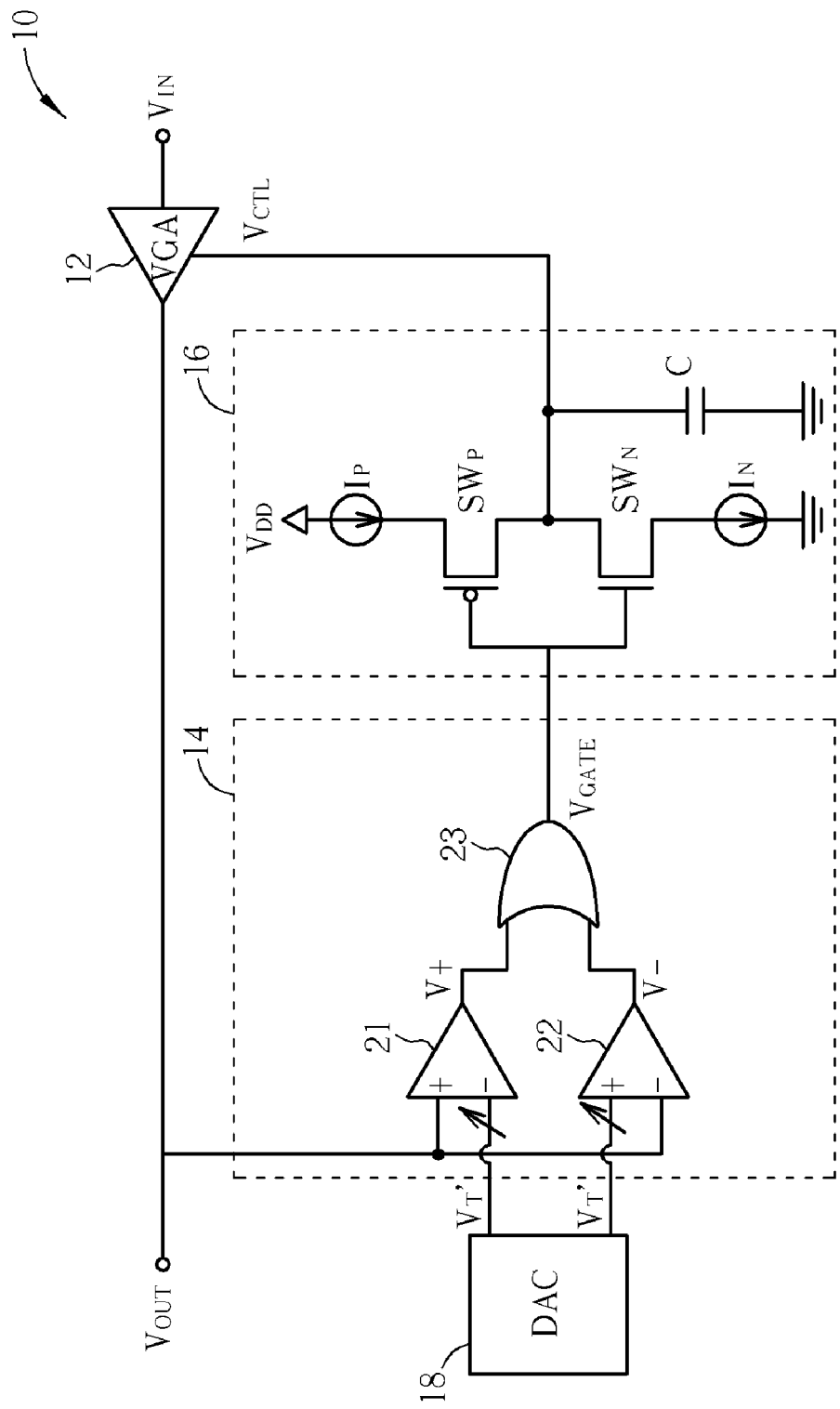
FIG. 1 is a diagram of a prior art AGC circuit.
Figure 2:
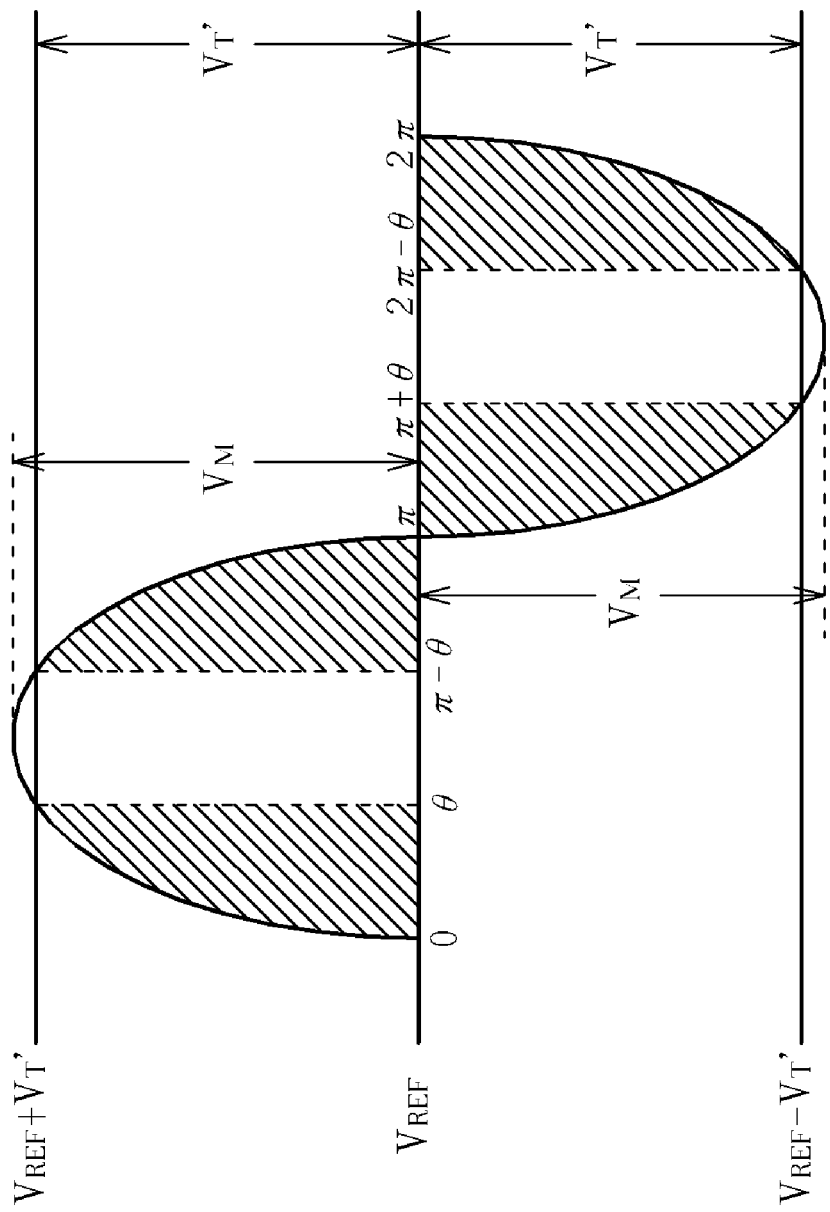
FIG. 2 is a signal diagram illustrating the operation of the prior art AGC circuit in FIG. 1.
Figure 3:
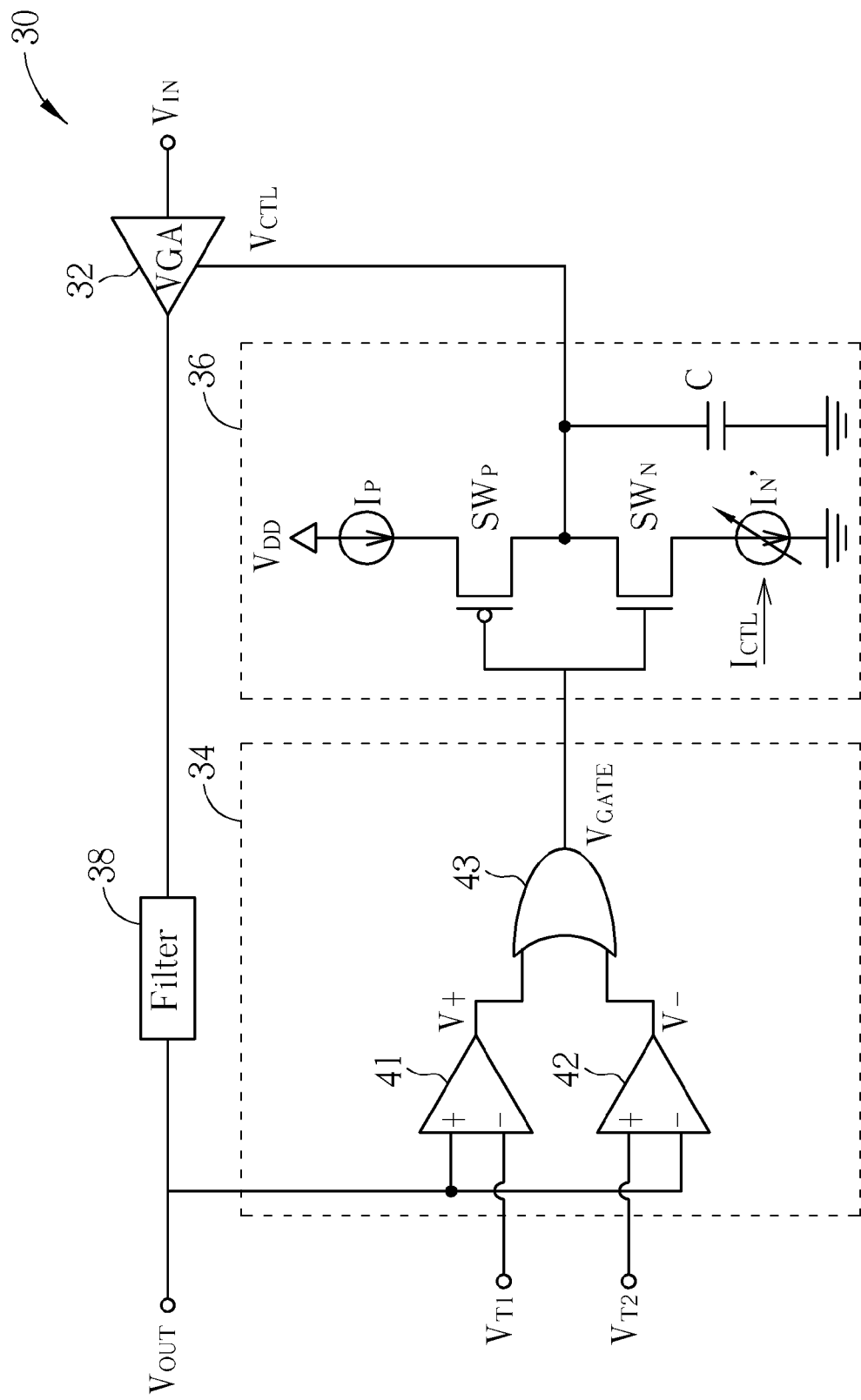
FIG. 3 is a diagram of an AGC circuit according to a first embodiment of the present invention.

Reference is made to FIG. 3 for a diagram of an AGC circuit 30 according to a first embodiment of the present invention. The AGC circuit 30 includes a VGA 32, a peak-detecting circuit 34, an adjustable charge/discharge circuit 36, and a filter 38. The VGA 32 receives an input signal $V_{IN}$ at an input end and adjusts the input signal $V_{IN}$ based on a gain-factor control signal $V_{CTL}$, thereby generating a corresponding output signal $V_{OUT}$ at an output end. The filter 38, coupled between the VGA 32 and the peak-detecting circuit 34, adjusts the operating voltage point of the output signal $V_{OUT}$ by removing bias voltages of the VGA 32. In the AGC circuit 30, the gain-factor control signal $V_{CTL}$ is generated by the peak-detecting circuit 34 and the adjustable charge/discharge circuit 36 based on the output signal $V_{OUT}$. Therefore, automatic-gain control can be performed in a feedback mechanism.

In the AGC circuit 30 of the present invention, the gain of the VGA 32 can be adjusted by varying the gain-factor control signal $V_{CTL}$ using the adjustable charge/discharge circuit 36. The peak-detecting circuit 34 includes a positive-phase differential comparator 41, negative-phase differential comparator 42, and an operational logic unit 43. The positive-phase differential comparator 41 includes a positive input end coupled to the VGA 32 for receiving the output signal $V_{OUT}$ and a negative input end for receiving a constant first reference signal $V_{T1}$. The positive-phase differential comparator 41 can differentially compare the output signal $V_{OUT}$ with the first reference signal $V_{T1}$, thereby generate a corresponding positive-phase comparing signal $V_+$ at its output end. The negative-phase differential comparator 42 includes a positive input end for receiving a constant second reference signal $V_{T2}$ and a negative end coupled to the VGA 32 for receiving the output signal $V_{OUT}$. The negative-phase differential comparator 42 can differentially compare the output signal $V_{OUT}$ with the second reference signal $V_{T2}$, thereby generate a corresponding negative-phase comparing signal $V_-$ at its output end. The operational logic unit 43 can include an OR gate coupled to the output ends of the positive-phase differential comparator 41 and the negative-phase differential comparator 42 and are capable of generating a corresponding comparing signal $V_{GATE}$ based on the positive-phase comparing signal $V_+$ and the negative-phase comparing signal $V_-$.

The adjustable charge/discharge circuit 36 includes a capacitor C, a constant charge current source $I_P$, a variable discharge current source $I_N'$, a charge switch $SW_P$, and a discharge switch $SW_N$. The charge switch $SW_P$ can include a PMOS transistor, and the discharge switch $SW_N$ can include an NMOS transistor. The gates of the charge switch $SW_P$ and the discharge switch $SW_N$ are coupled to the operational logic unit 43. When the comparing signal $V_{GATE}$ has a high voltage level, the charge switch $SW_P$ is turned off (open-circuited) and the discharge switch $SW_N$ is turned on (short-circuited). Therefore, the adjustable charge/discharge circuit 36 can discharge the capacitor C using the variable discharge current source $I_N'$ and the discharge switch $SW_N$. When the comparing signal $V_{GATE}$ has a low voltage level, the charge switch $SW_P$ is turned on and the discharge switch $SW_N$ is turned off. Therefore, the adjustable charge/discharge circuit 36 can charge the capacitor C using the constant charge current source $I_P$ and the charge switch $SW_P$. In the AGC circuit 30 of the present invention, the constant charge current source $I_P$ and the variable discharge current source $I_N'$ respectively provide a constant charge current and a variable discharge current, and the ratio between the charge current and the discharge current is adjustable based on a ratio control signal $I_{CTL}$. In such a situation, the AGC circuit 30 of the present invention implicitly includes a current ratio control module (not shown in FIG. 3) coupled to the adjustable charge/discharge circuit 36 for generating the ratio control signal $I_{CTL}$. It is noted that implementation of the current ratio control module has no concern with the spirit of the present invention, and that those skilled in the art can utilize any controller regardless of hardware or software to implement the current ratio control module as long as the ratio between the charge current $I_P$ and the discharge current $I_N'$ can be adjusted.

Figure 4:
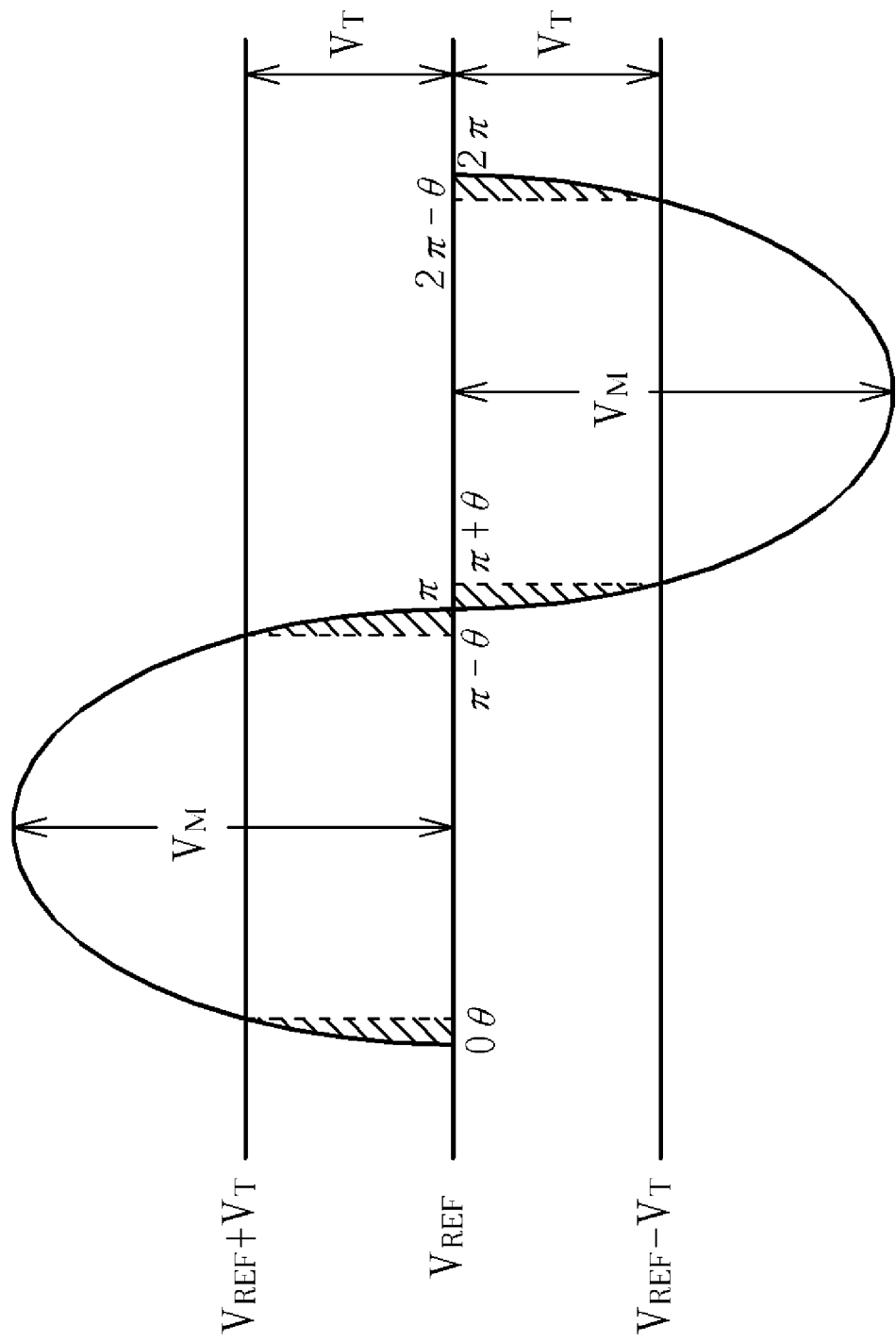
FIG. 4 is a signal diagram illustrating the operation of the AGC circuit in FIG. 3.

Reference is made to FIG. 4 for a signal diagram illustrating the operation of the AGC circuit 30 according to the present invention. In FIG. 4, the waveform of the output signal $V_{OUT}$ is represented by a sine wave having an amplitude $V_M$ and a central level $V_{REF}$. The transverse axle represents time, and a period $(0{\sim}2\pi)$ is depicted in FIG. 4. In the embodiment shown in FIG. 4, the first reference signal $V_{T1}$ and the second reference signal $V_{T2}$ are both set to a constant threshold signal $V_T$. When the absolute value of the output signal $V_{OUT}$ is smaller than that of the threshold signal $V_T$, the adjustable charge/discharge circuit 36 performs charging operation, such as during the time periods $0{\sim}\theta$, $(\pi-\theta){\sim}(\pi+\theta)$ and $(2-\theta){\sim}2\pi$ (as illustrated by diagonal regions of the sine wave in FIG. 4). When the absolute value of the output signal $V_{OUT}$ is larger than that of the threshold signal $V_T$, the adjustable charge/discharge circuit 36 performs discharging operation, such as during the time periods $\theta{\sim}(\pi-\theta)$ and $(\pi+\theta){\sim}(2\pi-\theta)$ (as illustrated by blank regions of the sine wave in FIG. 4). The value of $\theta$ depends on the level of the threshold voltage $V_T$. As the absolute value of the threshold voltage $V_T$ increases, the charging time $T_P(T_P=4\theta)$ of the adjustable charge/discharge circuit 36 becomes longer. As the absolute value of the threshold voltage $V_T$ decreases, the discharging time $T_N(T_N=2\pi-4\theta)$ of the adjustable charge/discharge circuit 36 becomes longer.

When the AGC circuit 30 performs charging and discharging operations, corresponding charging electronic charges $Q_P$ and discharging electronic charges $Q_N$ can be represented by the following formulae:

$$Q_P = I_P T_P = I_P(4\theta)$$

$$Q_N = I_N T_N = I_N(2\pi-4\theta)$$

When the AGC circuit 30 is stabilized, the charging electronic charges $Q_P$ and the discharging electronic charges $Q_N$ reach an equilibrium state. Therefore, the following relationships can be obtained:

$$Q_P = Q_N$$

$$I_N/I_P = 2\theta/(\pi-2\theta)$$

If N' is used for representing the value of $I_N'/I_P$, the value of $\theta$ can be represented by the following formula:

$$\theta = \frac{\pi}{2} \times \frac{N'}{N'+1}$$

Also, the relationship between the amplitude $V_M$ of the output signal $V_{OUT}$ and the threshold signal $V_T$ can be represented by the following formula:

$$V_M \sin\theta = V_T$$

Therefore, the following relationship can be obtained:

$$V_M = V_T/\sin\theta = V_T \bigg/ \sin\left(\frac{\pi}{2} \times \frac{N'}{N'+1}\right)$$

In the AGC circuit 30 of the first embodiment of the present invention, the value of the threshold signal $V_T$ is constant and does not have to be close to the target amplitude $V_M$ of the output signal $V_{OUT}$. The gain of the VGA 32 can be varied by adjusting the value of N'. Therefore, the AGC circuit 30 only requires a mid/low-speed positive-phase differential comparator 21 and a mid/low-speed negative-phase differential comparator 22 for accurately determining the difference between the threshold signal $V_T$ and the output signal $V_{OUT}$, so that the AGC circuit 30 can switch between charging/discharging operations correctly. The costs for the differential comparators can thus be reduced. Also, instead of providing the threshold signals $V_T'$ of distinct amplitudes in the prior art, the first embodiment of the present invention occupies less circuit space and consumes less power by providing the constant first and second threshold signals $V_{T1}$ and $V_{T2}$ (the first and second threshold signals $V_{T1}$ and $V_{T2}$ can be set to a constant threshold signal $V_T$ simultaneously).

Figure 5:
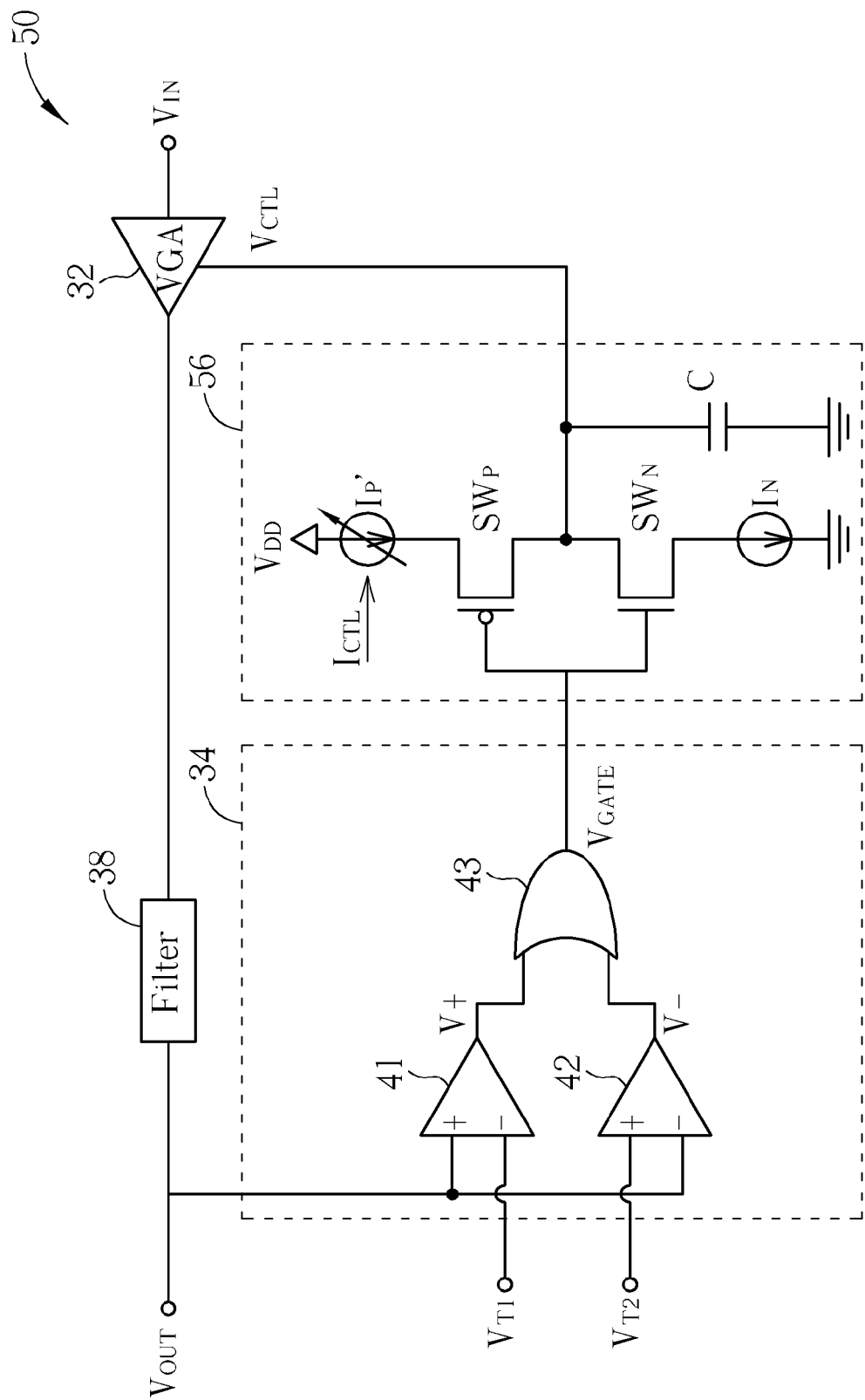
FIG. 5 is a diagram of an AGC circuit according to a second embodiment of the present invention.

Reference is made to FIG. 5 for a diagram of an AGC circuit 50 according to a second embodiment of the present invention. The AGC circuit 50 includes a VGA 32, a peak-detecting circuit 34, an adjustable charge/discharge circuit 56, and a filter 38. In the second embodiment of the present invention, the adjustable charge/discharge circuit 56 includes a capacitor C, a variable charge current source $I_P'$, a constant discharge current source $I_N$, a charge switch $SW_P$, and a discharge switch $SW_N$. Similarly, the ratio between the charge current $I_P'$ and the discharge current $I_N$ is adjustable based on a ratio control signal $I_{CTL}$, generated by a current ratio control module. If N' is used for representing the value of $I_N/I_P'$ and the first reference signal $V_{T1}$ and the second reference signal $V_{T2}$ are both set to a constant threshold signal $V_T$, the relationship between the amplitude $V_M$ of the output signal $V_{OUT}$ and the threshold signal $V_T$ can be represented by the following formula:

$$V_M = V_T/\sin\theta = V_T \Big/ \sin\left(\frac{\pi}{2} \times \frac{N'}{N'+1}\right)$$

Therefore, in the AGC circuit 50 of the second embodiment of the present invention, the gain of the VGA 32 can be varied by adjusting the value of N'. A mid/low-speed positive-phase differential comparator 41 and a mid/low-speed negative-phase differential comparator 42 are required for determining the difference between the threshold signal $V_T$ and the output signal $V_{OUT}$ accurately, so that the AGC circuit 50 can switch between charging/discharging operations correctly. The costs for the differential comparators can thus be reduced. Also, instead of providing the threshold signals $V_T$' of distinct amplitudes as in the prior art, the second embodiment of the present invention occupies less circuit space and consumes less power by providing the constant first and second threshold signals $V_{T1}$ and $V_{T2}$ (the first and second threshold signals $V_{T1}$ and $V_{T2}$ can be set to a constant threshold signal $V_T$ simultaneously).

Figure 6:
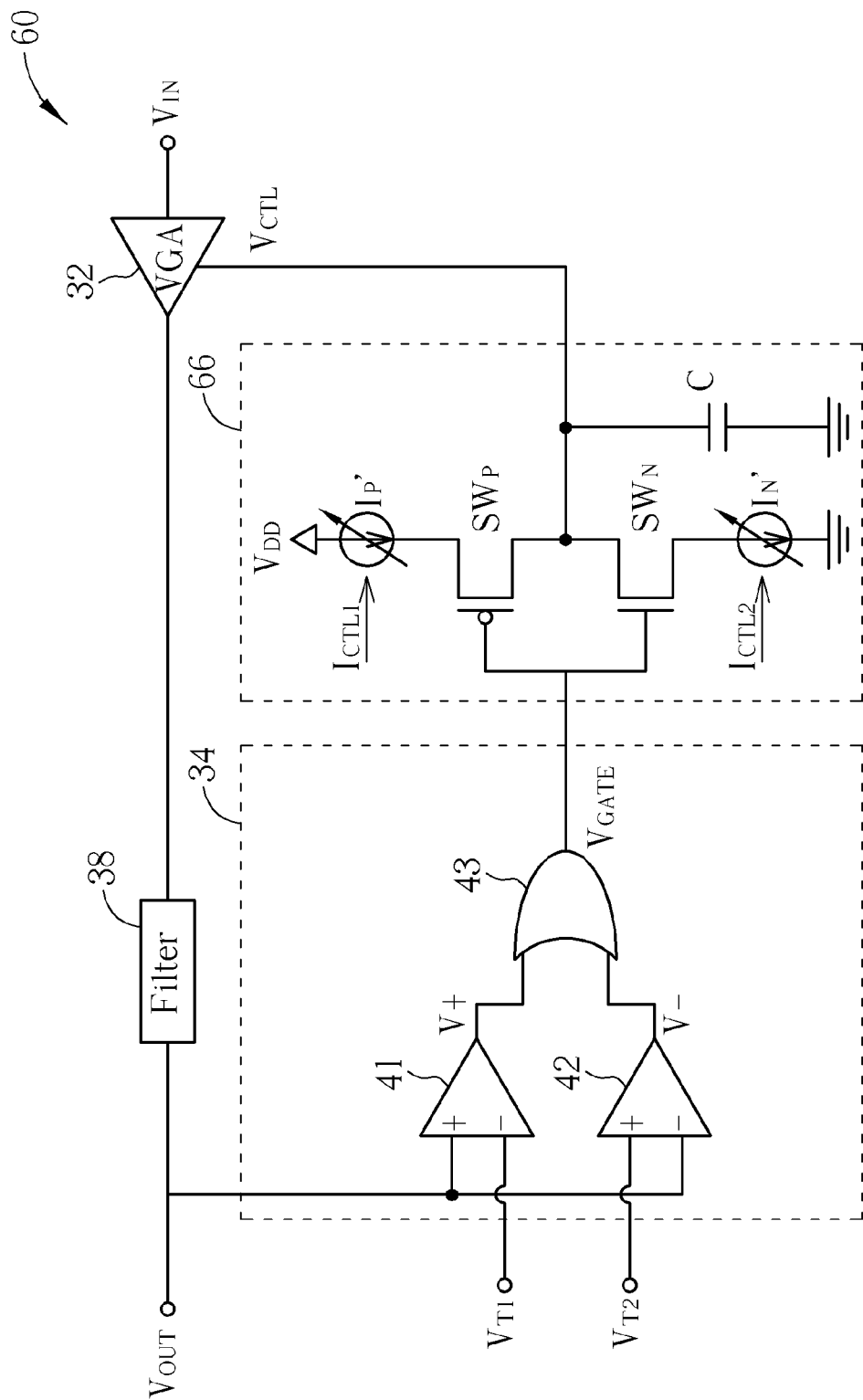
FIG. 6 is a diagram of an AGC circuit according to a third embodiment of the present invention.

Reference is made to FIG. 6 for a diagram of an AGC circuit 60 according to a third embodiment of the present invention. The AGC circuit 60 includes a VGA 32, a peak-detecting circuit 34, an adjustable charge/discharge circuit 66, and a filter 38. In the third embodiment of the present invention, the adjustable charge/discharge circuit 66 includes a capacitor C, a variable charge current source $I_P$', a variable discharge current source $I_N$', a charge switch $SW_P$, and a discharge switch $SW_N$. Similarly, the ratio between the charge current $I_P$' and the discharge current $I_N$ is adjustable based on ratio control signals $I_{CTL1}$ and $I_{CTL2}$, generated by a current ratio control module. If N' is used for representing the value of $I_N'/I_P'$ and the first reference signal $V_{T1}$ and the second reference signal $V_{T2}$ are both set to a constant threshold signal $V_T$, the relationship between the amplitude $V_M$ of the output signal $V_{OUT}$ and the threshold signal $V_T$ can be represented by the following formula:

$$V_M = V_T/\sin\theta = V_T \Big/ \sin\left(\frac{\pi}{2} \times \frac{N'}{N'+1}\right)$$

Therefore, in the AGC circuit 60 of the third embodiment of the present invention, the gain of the VGA 32 can be varied by adjusting the value of N'. A mid/low-speed positive-phase differential comparator 41 and a mid/low-speed negative-phase differential comparator 42 are required for determining the difference between the threshold signal $V_T$ and the output signal $V_{OUT}$ accurately, so that the AGC circuit 50 can switch between charging/discharging operations correctly. The costs for the differential comparators can thus be reduced. Also, instead of providing the threshold signals $V_T$' of distinct amplitudes as in the prior art, the third embodiment of the present invention occupies less circuit space and consumes less power by providing the constant first and second threshold signals $V_{T1}$ and $V_{T2}$ (the first and second threshold signals $V_{T1}$ and $V_{T2}$ can be set to a constant threshold signal $V_T$ simultaneously).

In the present invention, the gain of the VGA can be changed by adjusting the charge/discharge currents using a variable current source. Since only a low/mid-speed differential comparator is required, the manufacturing costs can thus be reduced. Also, by providing a constant threshold signal instead of providing various threshold signals using a DAC, the present invention occupies less circuit space and consumes less power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An automatic-gain control circuit comprising:
    a variable-gain amplifier for receiving an input signal and adjusting the input signal based on a gain-factor control signal, thereby generating a corresponding output signal;
    a peak-detecting circuit coupled to the variable-gain amplifier for generating a comparing signal based on a reference signal and the output signal;
    an adjustable charge/discharge circuit having an input end coupled to the peak-detecting circuit and an output end coupled to the variable-gain amplifier for outputting a charge current or a discharge current based on the comparing signal, thereby generating the gain-factor control signal, wherein a ratio between the charge current and the discharge current is adjustable based on a ratio control signal; and
    a current ratio control module coupled to the adjustable charge/discharge circuit for generating the ratio control signal.

2. The automatic-gain control circuit of claim 1 wherein the adjustable
    charge/discharge circuit comprises:
    a variable charge current source for providing a variable charge current;
    a constant discharge current source for providing a constant discharge current;
    a first switch for controlling a current transmission path between the variable charge current source and the output end of the adjustable charge/discharge circuit based on the comparing signal; and
    a second switch for controlling a current transmission path between the constant discharge current source and the output end of the adjustable charge/discharge circuit based on the comparing signal.

3. The automatic-gain control circuit of claim 2 further comprising:
    a capacitor coupled to the output end of the adjustable charge/discharge circuit for generating the gain-factor control signal based on the variable charge current and the constant discharge current.

4. The automatic-gain control circuit of claim 2 wherein the first switch includes a P-type metal oxide semiconductor (PMOS) transistor and the second switch includes an N-type metal oxide semiconductor (NMOS) transistor.

5. The automatic-gain control circuit of claim 1 wherein the adjustable
    charge/discharge circuit comprises:
    a constant charge current source for providing a constant charge current;
    a variable discharge current source for providing a variable discharge current;
    a first switch for controlling a current transmission path between the constant charge current source and the output end of the adjustable charge/discharge circuit based on the comparing signal; and
    a second switch for controlling a current transmission path between the variable discharge current source and the output end of the adjustable charge/discharge circuit based on the comparing signal.

6. The automatic-gain control circuit of claim 5 further comprising:
a capacitor coupled to the output end of the adjustable charge/discharge circuit for generating the gain-factor control signal based on the constant charge current and the variable discharge current.

7. The automatic-gain control circuit of claim 6 wherein the first switch includes a PMOS transistor and the second switch includes an NMOS transistor.

8. The automatic-gain control circuit of claim 1 wherein the adjustable
charge/discharge circuit comprises:
a variable charge current source for providing a variable charge current;
a variable discharge current source for providing a variable discharge current;
a first switch for controlling a current transmission path between the variable charge current source and the output end of the adjustable charge/discharge circuit based on the comparing signal; and
a second switch for controlling a current transmission path between the variable discharge current source and the output end of the adjustable charge/discharge circuit based on the comparing signal.

9. The automatic-gain control circuit of claim 8 further comprising:
a capacitor coupled to the output end of the adjustable charge/discharge circuit for generating the gain-factor control signal based on the variable charge current and the variable discharge current.

10. The automatic-gain control circuit of claim 8 wherein the first switch includes a PMOS transistor and the second switch includes an NMOS transistor.

11. The automatic-gain control circuit of claim 1 wherein the peak-detecting circuit comprises:
a positive-phase differential comparator coupled to the variable-gain amplifier for differentially comparing a first reference signal with the output signal, thereby generating a corresponding positive-phase comparing signal;
a negative-phase differential comparator coupled to the variable-gain amplifier for differentially comparing a second reference signal with the output signal, thereby generating a corresponding negative -phase comparing signal; and
an operational logic unit coupled to the positive-phase differential comparator, the negative-phase differential comparator and the adjustable charge/discharge circuit for generating the comparing signal based on the positive-phase comparing signal and the negative-phase comparing signal.

12. The automatic-gain control circuit of claim 11 wherein the operational logic unit includes an OR gate.

13. The automatic-gain control circuit of claim 11 wherein the first and second reference signals are identical.

14. The automatic-gain control circuit of claim 1 further comprising a filter coupled between the variable-gain amplifier and the peak-detecting circuit.

* * * * *